United States Patent
Kishioka et al.

(10) Patent No.: US 11,372,330 B2
(45) Date of Patent: Jun. 28, 2022

(54) ANTI-REFLECTIVE COATING FORMING COMPOSITION CONTAINING REACTION PRODUCT OF ISOCYANURIC ACID COMPOUND WITH BENZOIC ACID COMPOUND

(75) Inventors: Takahiro Kishioka, Toyama (JP); Rikimaru Sakamoto, Toyama (JP); Daisuke Maruyama, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 11/992,595

(22) PCT Filed: Sep. 27, 2005

(86) PCT No.: PCT/JP2005/017735
§ 371 (c)(1),
(2), (4) Date: Mar. 26, 2008

(87) PCT Pub. No.: WO2007/036982
PCT Pub. Date: Apr. 5, 2007

(65) Prior Publication Data
US 2009/0117493 A1 May 7, 2009

(51) Int. Cl.
*G03F 7/09* (2006.01)
(52) U.S. Cl.
CPC .................................. *G03F 7/091* (2013.01)
(58) Field of Classification Search
CPC ... G03F 7/091; G03F 7/11; G03F 7/20; H01Q 1/242; H01Q 9/0485; H01Q 13/00; H01Q 13/04; H01Q 1/24; H01Q 1/38; H01Q 5/01; H01Q 9/04; H01Q 13/24; C08G 18/79; C08G 73/06; G02B 1/04; H01P 5/08; H01P 7/10
USPC ............................... 252/589; 430/271.1, 315
See application file for complete search history.

(56) References Cited

U.S. PATENT DOCUMENTS

| | | | |
|---|---|---|---|
| 5,939,236 A * | 8/1999 | Pavelchek et al. | 430/273.1 |
| 6,033,830 A * | 3/2000 | Sinta et al. | 430/325 |
| 6,410,209 B1 * | 6/2002 | Adams et al. | 430/311 |
| 2002/0028408 A1 * | 3/2002 | Mao et al. | 430/271.1 |
| 2004/0110089 A1 | 6/2004 | Neef et al. | |
| 2006/0290429 A1 * | 12/2006 | Kishioka et al. | 330/292 |
| 2007/0135581 A1 * | 6/2007 | Takei et al. | 525/329.7 |
| 2008/0206680 A1 | 8/2008 | Kishioka et al. | |

FOREIGN PATENT DOCUMENTS

| | | |
|---|---|---|
| EP | 1 178 354 A1 | 2/2002 |
| EP | 1 298 492 A2 | 4/2003 |
| EP | 1 298 493 A2 | 4/2003 |
| EP | 1378796 A1 * | 1/2004 |
| JP | A-10-204110 | 8/1998 |
| JP | A-11-038622 | 2/1999 |
| JP | A-11-133618 | 5/1999 |
| JP | A-11-279523 | 10/1999 |
| JP | A-2005-062591 | 3/2005 |
| JP | A-2005-62591 | 3/2005 |
| WO | WO 2002/086624 A1 | 10/2002 |
| WO | WO 2004/034148 A1 | 4/2004 |
| WO | WO 2004/034435 A2 * | 4/2004 |
| WO | WO 2005/098542 A1 | 10/2005 |

OTHER PUBLICATIONS

Category:Benzoic acid—Wikipedia, the free encyclopedia, 2 pages, downloaded Sep. 28, 2009 at http://en.wikipedia.org/wiki/Category:Benzoic acids.*
CAS Registry No. 2451-62-9 one page obtained from SciFinder Database on Sep. 21, 2014 from American Chemical Society.*
May 3, 2010 extended European Search Report issued in EP 05 78 8391.

* cited by examiner

*Primary Examiner* — Duane Smith
(74) *Attorney, Agent, or Firm* — Oliff PLC

(57) ABSTRACT

There is provided anti-reflective coating forming composition containing a reaction product of an isocyanuric acid compound having two or three 2,3-epoxypropyl groups with a benzoic acid compound. The anti-reflective coating obtained from the composition has a high preventive effect for reflected light, causes no intermixing with photoresists, can form a photoresist pattern having no footing at the lower part, and can use in lithography process by use of a light such as ArF excimer laser beam and F2 excimer laser beam, etc.

2 Claims, No Drawings

ANTI-REFLECTIVE COATING FORMING COMPOSITION CONTAINING REACTION PRODUCT OF ISOCYANURIC ACID COMPOUND WITH BENZOIC ACID COMPOUND

TECHNICAL FIELD

The present invention relates to a composition for forming an anti-reflective coating. Specifically, the present invention relates to an anti-reflective coating for reducing reflection of irradiation light for exposing from a semiconductor substrate to a photoresist layer applied on the semiconductor substrate, and a composition for forming the anti-reflective coating. More specifically, the present invention relates to an anti-reflective coating used in a lithography process of a manufacture of semiconductor devices that is carried out by use of an irradiation light for exposure such as a light at wavelength of 248 nm, 193 nm and 157 nm or the like, and a composition for forming the anti-reflective coating. Further, the present invention relates to a method for forming photoresist pattern by use of the anti-reflective coating.

BACKGROUND ART

Conventionally, in the manufacture of semiconductor devices, micro-processing by lithography using a photoresist composition has been carried out. The micro-processing is a processing method comprising forming a thin film of a photoresist composition on a silicon wafer, irradiating actinic rays such as ultraviolet rays through a mask pattern on which a pattern for the device is depicted, developing it to obtain a resist pattern, and etching the silicon wafer using the resist pattern as a protective film. However, in recent progress in high integration of semiconductor devices, there has been a tendency that shorter wavelength actinic rays are being used, i.e., ArF excimer laser beam (wavelength 193 nm) has been taking the place of i-line (wavelength 365 nm) or KrF excimer laser beam (wavelength 248 nm). Along with this change, affects by random reflection or standing wave of irradiation light of the actinic rays from a substrate have become large problems. Accordingly, it has been widely studied to provide an anti-reflective coating (bottom anti-reflective coating) between the photoresist and the substrate.

As the anti-reflective coatings, inorganic anti-reflective coatings made of titanium, titanium dioxide, titanium nitride, chromium oxide, carbon, α-silicon, etc. and organic anti-reflective coatings made of a light absorbing substance and a polymer compound, etc. are known. The former requires an installation such as a vacuum deposition apparatus, a CVD apparatus or a sputtering apparatus, etc. In contrast, the latter is considered advantageous in that it requires no special installation so that many studies have been made. For example, mention may be made of the acrylic resin type anti-reflective coating having a hydroxyl group being a crosslink-forming substituent and a light absorbing group in the same molecule as disclosed in U.S. Pat. No. 5,919,599 and the novolak resin type anti-reflective coating having a hydroxyl group being a crosslink-forming substituent and a light absorbing group in the same molecule as disclosed in U.S. Pat. No. 5,693,691.

The physical properties desired for organic anti-reflective coating include high absorbance to light or radiation, no intermixing with a photoresist layer (being insoluble in a photoresist solvent), no diffusion of low molecular weight compounds from the anti-reflective coating material into the topcoat photoresist, and a higher dry etching rate than a photoresist, and so on.

In recent years, miniaturization of processing size in a lithography process by use of KrF excimer laser beam or ArF excimer laser beam, that is, miniaturization of formed photoresist pattern size is advanced. In order to prevent collapse or the like of photoresist pattern that is accompanied with miniaturization of photoresist pattern, it is desired to make the photoresist thinner. In addition, when the photoresist is used in a form of thin film, in order to inhibit decrease in film thickness of photoresist layer in the process of removing organic anti-reflective coating used together by etching, it is desired that the organic anti-reflective coating can be removed by etching for a shorter time. That is, in order to make the time required for an etching removing step shorter, there are demands for organic anti-reflective coatings that can be used in a form of thinner film compared with the conventional ones, or for organic anti-reflective coatings having a higher selection ratio of etching rate to photoresists compared with the conventional one.

It is also requested for anti-reflective coatings to be able to form a photoresist pattern having a good shape. In particular, it is required to be able to form a photoresist pattern having no large footing at the lower part. This is because the photoresist pattern having footing exerts adverse effects on the following processing steps.

In addition, the kinds of photoresists used increase with the progress of lithography technique. Therefore, it is always desired to develop novel anti-reflective coatings in order to adapt to the use of the diverse photoresists.

In the meanwhile, a technique in which tris(hydroxyalkyl) isocyanurate substituted with an aromatic a compound or an alicyclic compound is used as a broad UV absorber (see, for example Patent Document 1), or a curing composition containing cyanuric acid as a polymerizable organic compound (see, for example Patent Document 2) is known. In addition, an anti-reflective coating composition containing a cyanuric acid compound is known (see, for example Patent Document 3). Further, it is disclosed to use a polyester synthesized from 1,3,5-tris(2-hydroxyethyl) cyanuric acid as an anti-reflective coating (see, for example Patent Documents 4 and 5).

In addition, an anti-reflective coating composition containing a resin binder and a photoacid generator, or the like is known (see, for example Patent Document 6). Further, an anti-reflective coating forming composition containing a nitrogen-containing compound and a compound that generates an acid with irradiation of actinic rays (see, for example Patent Document 7).

Patent Document 1: JP-A-11-279523 (1999)
Patent Document 2: JP-A-10-204110 (1998)
Patent Document 3: WO 02/086624 Pamphlet
Patent Document 4: EP-A-1298492
Patent Document 5: EP-A-1298493
Patent Document 6: JP-A-11-133618 (1999)
Patent Document 7: JP-A-11-38622 (1999)

DISCLOSURE OF INVENTION

Problem to be Solved by the Invention

The present invention relates to an anti-reflective coating forming composition for lithography in which the anti-reflective coating has a strong light absorption at short wavelength, particularly wavelength of 193 nm or 157 nm. An object of the present invention is to provide an anti-reflective coating composition that can be used in lithography process for manufacturing a semiconductor device by use of irradiation light of ArF excimer laser beam (wavelength 193 nm) or F2 excimer laser beam (wavelength 157 nm). Another object of the present invention is to provide an anti-reflective coating that effectively absorbs light reflected from a substrate, causes no intermixing with a photoresist layer and has a higher dry etching rate compared with a photoresist, when irradiation light of ArF excimer laser beam or F2 excimer laser beam is used for fine processing, and to provide an anti-reflective coating forming composition for forming the anti-reflective coating. Other object of the present invention is also to provide an anti-reflective coating that can form a photoresist pattern having no large footing at the lower part, and an anti-reflective coating forming composition that is used therefor.

Further, an object of the present invention is to provide a method for forming anti-reflective coating for lithography and a method for forming photoresist pattern, by use of the anti-reflective coating forming composition.

Means for Solving the Problem

Taking the above-mentioned present status into account, the present inventors have eagerly studied, as a result, they found that an anti-reflective coating forming composition containing a reaction product of an isocyanuric acid compound having two or three 2,3-epoxypropyl groups with a benzoic acid compound can form an anti-reflective coating having excellent performances in a process in which light of a short wavelength, particularly ArF excimer laser beam or F2 excimer laser beam is used, and completed the present invention.

That is, as a first aspect, the present invention relates to an anti-reflective coating forming composition comprising a reaction product of a compound of formula (1)

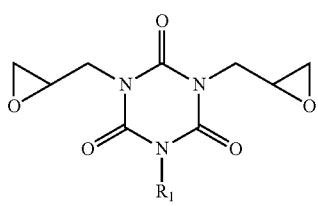

(1)

wherein $R_1$ is $C_{1-6}$alkyl, benzyl, 2-propenyl, 2,3-epoxypropyl or phenyl, with a benzoic acid compound, a crosslinking compound and a solvent, and either or both of a photoacid generator or an acid compound.

As a second aspect, the present invention relates to the anti-reflective coating forming composition as described in the first aspect, containing the reaction product, the crosslinking compound, the solvent, and the acid compound.

As a third aspect, the present invention relates to the anti-reflective coating forming composition as described in the first aspect, containing the reaction product, the photoacid generator, the crosslinking compound, and the solvent.

As a fourth aspect, the present invention relates to the anti-reflective coating forming composition as described in the first aspect, containing the reaction product, the photoacid generator, the crosslinking compound, the solvent, and the acid compound.

As a fifth aspect, the present invention relates to the anti-reflective coating forming composition as described in any one of the first to fourth aspects, wherein the compound of formula (1) is tris(2,3-epoxypropyl)isocyanuric acid.

As a sixth aspect, the present invention relates to the anti-reflective coating forming composition as described in any one of the first to fourth aspects, wherein the benzoic acid compound is a hydroxy benzoic acid compound having a halogen substituent.

As a seventh aspect, the present invention relates to the anti-reflective coating forming composition as described in the sixth aspect, wherein the halogen substituent is bromo group or iodo group.

As an eighth aspect, the present invention relates to the anti-reflective coating forming composition as described in the sixth aspect, wherein the hydroxy benzoic acid compound having a halogen substituent is a compound selected from the group consisting of 2,5-dichloro-3-hydroxy-6-methoxy benzoic acid, 2,4,6-triiodo-3-hydroxy benzoic acid, 2,4,6-tribromo-3-hydroxy benzoic acid, 2-bromo-4,6-dimethyl-3-hydroxy benzoic acid, 2-fluoro-5-hydroxy benzoic acid, 3,5-dibromo-4-hydroxy benzoic acid, 2,4-dihydroxy-5-bromo benzoic acid, 3-iodo-5-nitro-4-hydroxy benzoic acid, 4-chloro-2-hydroxy benzoic acid, 3,5-diiodo-2-hydroxy benzoic acid, 4-amino-3,5-diiodo-2-hydroxy benzoic acid, and 3,5-dibromo-2-hydroxy benzoic acid, and the like.

As a ninth aspect, the present invention relates to the anti-reflective coating forming composition as described in any one of the first to fourth aspects, wherein the reaction product of a compound of formula (1) with a benzoic acid compound is a reaction product obtained by reacting the compound of formula (1) with the benzoic acid compound in a molar ratio of 1:2 to 1:3 shown in the compound of formula (1): the benzoic acid compound.

As a tenth aspect, the present invention relates to an anti-reflective coating obtained by coating the anti-reflective coating forming composition as described in any one of the first to ninth aspects on a semiconductor substrate, and baking it.

As an eleventh aspect, the present invention relates to a method for forming photoresist pattern for use in manufacture of semiconductor device, comprising the steps of:
coating the anti-reflective coating forming composition as described in any one of the first to ninth aspects on a semiconductor substrate, and baking it to form an anti-reflective coating,
forming a photoresist layer on the anti-reflective coating,
exposing the semiconductor substrate covered with the anti-reflective coating and the photoresist layer to light, and developing the photoresist layer after the exposure to light.

As a twelfth aspect, the present invention relates to a method for forming photoresist pattern for use in manufacture of semiconductor device, comprising the steps of:
coating the anti-reflective coating forming composition as described in any one of the first to ninth aspects on a semiconductor substrate, and baking it to form an anti-reflective coating,
forming a photoresist layer on the anti-reflective coating,
exposing the semiconductor substrate covered with the anti-reflective coating and the photoresist layer to irradiation light of F2 excimer laser beam (wavelength 157 nm), and developing the photoresist layer after the exposure to light.

Effect of the Invention

The present invention is a composition for forming an anti-reflective coating having a strong absorption to a light having a short wavelength, particularly ArF excimer laser beam (wavelength 193 nm) or F2 excimer laser beam (wavelength 157 nm). The anti-reflective coating obtained therefrom effectively absorbs a light reflected from a substrate.

The present invention can provide an anti-reflective coating that effectively absorbs a light reflected from a semiconductor substrate in fine processing by use of ArF excimer laser beam and F2 excimer laser beam or the like, and that causes no intermixing with a photoresist layer.

The present invention can provide an anti-reflective coating that can form a photoresist pattern having little footing at the lower part.

Further, the use of the anti-reflective coating of the present invention makes possible to form a good photoresist pattern in lithography process by use of ArF excimer laser beam (wavelength 193 nm) or the like.

BEST MODE FOR CARRYING OUT THE INVENTION

The present invention relates to an anti-reflective coating forming composition characterized by comprising a reaction product of a compound of formula (1) with a benzoic acid compound, a photoacid generator, a crosslinking compound, and a solvent. In addition, the present invention relates to an anti-reflective coating forming composition characterized by comprising a reaction product of a compound of formula (1) with a benzoic acid compound, a photoacid generator, a crosslinking compound, a solvent, and an acid compound. Further, the present invention relates to an anti-reflective coating forming composition comprising a reaction product of a compound of formula (1) with a benzoic acid compound, a crosslinking compound, a solvent, and an acid compound.

And, the anti-reflective coating forming composition of the present invention can contain further a polymer component, a light absorbing compound and a surfactant, or the like.

The proportion of solid content in the anti-reflective coating forming composition of the present invention is not specifically limited so long as each component homogeneously dissolves in the solvent, for example it is 0.5 to 50 mass %, or 1 to 30 mass %, or 10 to 25 mass %. In this specification, the solid content means all components of the anti-reflective coating forming composition from which the solvent component is excluded.

The anti-reflective coating forming composition of the present invention contains a reaction product of a compound of formula (1) with a benzoic acid compound. In formula (1), $R_1$ is $C_{1-6}$alkyl, benzyl, 2-propenyl, 2,3-epoxypropyl or phenyl. The alkyl includes methyl, ethyl, isopropyl, cyclohexyl, and normal pentyl, or the like.

It is preferable to perform the reaction of a compound of formula (1) with a benzoic acid in a solution state dissolved in an organic solvent such as benzene, toluene, xylene, ethyl lactate, butyl lactate, propylene glycol monomethyl ether, propylene glycol monomethyl ether acetate, and N-methylpyrrolidone, or the like. And, in the reaction, a quaternary ammonium salt such as benzyl triethyl ammonium chloride, tetrabutyl ammonium chloride, and tetraethyl ammonium bromide or the like can be used as a catalyst. The reaction temperature and the reaction time of the reaction depend on the used compounds, the concentration thereof, and the like, and are suitably selected from a reaction time ranging from 0.1 to 100 hours or 1 to 50 hours and a reaction temperature ranging from 20 to 200° C. or 50 to 180° C. When the catalyst is used, it can be used in a range of 0.001 to 30 mass % based on the whole mass of the used compounds.

The proportion of the compound of formula (1) and the benzoic acid that are used in the reaction is for example 5:1 to 1:5, or 3:1 to 1:3, or 1:1 to 1:3, or 1:2 to 1:3, or 2:5 to 1:3 in a molar ratio of the compound of formula (1): the benzoic acid compound, The reaction product contained in the anti-reflective coating forming composition of the present invention can be obtained for example as follows. A compound of formula (1) and a benzoic acid compound are dissolved in a suitable organic solvent in a molar ratio of 1:2 to 1:3 and a concentration of 15 to 35 mass %. Then, a quaternary ammonium salt such as benzyl triethyl ammonium chloride or the like is added in a ratio of 0.5 to 3 mass % based on the whole mass of the used compounds from which the organic solvent is excluded. Thereafter, the reaction is performed at a temperature of 100 to 150° C. for a reaction time of 10 to 30 hours and the reaction product can be obtained. The reaction product can be also obtained by dissolving a compound of formula (1) and a benzoic acid compound in a suitable organic solvent in a molar ratio of 1:2 to 1:3 and a concentration of 40 to 60 mass %, and then without an addition of a quaternary ammonium salt, performing a reaction at a temperature of 100 to 150° C. for a reaction time of 10 to 30 hours.

The reaction of the compound of formula (1) with the benzoic acid compound causes epoxy ring opening reaction between the epoxy group of formula (1) and the carboxy group of the benzoic acid compound to provide the reaction product.

When the benzoic acid compound is shown by A-COOH (wherein A is a benzene ring that may have any substituents), 2,3-epoxypropyl group on the nitrogen atom of formula (1) is converted into the group of the following formula (2) by the reaction with the benzoic acid compound.

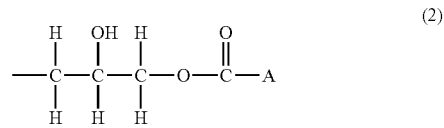

It is thought that the reaction products obtained by the reaction of the compound of formula (1) with the benzoic acid compound depend on the proportion of the compounds used for the reaction, and there are cases providing a reaction product in which one 2,3-epoxypropyl group of formula (1) is converted into the group of formula (2) and providing a reaction product in which two 2,3-epoxypropyl groups are converted into the groups of formula (2). In addition, when $R_1$ is 2,3-epoxypropyl in formula (1), it is also thought that the reaction product in which all of three 2,3-epoxypropyl groups are converted into the groups of formula (2) is obtained. Therefore, it is thought that there are cases where the reaction product of the compound of formula (1) with the benzoic acid compound is only one compound and a mixture of two or more compounds. The reaction product of the compound of formula (1) with the benzoic acid compound contained in the anti-reflective coating forming composition of the present invention may be one compound or a mixture of two or more compounds.

In addition, when the benzoic acid compound used for the reaction with the compound of formula (1) is a hydroxy benzoic acid compound or a compound having two carboxy groups such as a phthalic acid compound, it is supposed that the carboxy group and hydroxy group on these compounds, or both carboxy groups cause epoxy ring-opening reaction with 2,3-epoxypropyl group of formula (1).

When the hydroxy benzoic acid compound and phthalic acid compound are shown by HOOC—B—(C=O)$_n$—OH (wherein B is a benzene ring that may have any substituents, n is 0 or 1, in case of n=0, the compound is a hydroxy benzoic acid compound, and in case of n=1, the compound is a phthalic acid compound), one carboxy group is reacted with 2,3-epoxypropyl group of formula (1) and converted into the following formula (3).

In addition, it is supposed that when the remaining carboxy group or hydroxy group of formula (3) is reacted with other 2,3-epoxypropyl group, the reaction product having the following formula (4) is produced. Further, it is also supposed that the reaction product having the structure of formula (4) in a continuous state, that is, an oligomer (or polymer) is obtained.

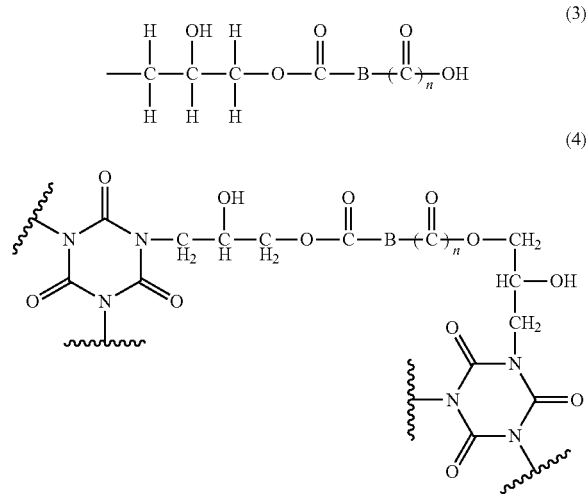

Therefore, it is thought that when a hydroxy benzoic acid compound or a compound having two carboxy groups is used as the benzoic acid compound, there are cases in which the reaction product is one compound, two or more compounds, an oligomer (or polymer), or a mixture thereof. Any one thereof may be used as the reaction product contained in the anti-reflective coating forming composition of the present invention.

The compound of formula (1) that is used for the reaction product contained in the anti-reflective coating forming composition of the present invention includes 2-propenyl-diglycidyl isocyanuric acid, phenyldiglycidyl isocyanuric acid and tris(2,3-epoxypropyl) isocyanuric acid, or the like.

The benzoic acid compound that is used for the reaction product contained in the anti-reflective coating forming composition of the present invention is not specifically limited, and for example benzoic acid can be used. In addition, benzoic acid compounds substituted with the group consisting of alkyl such as methyl, ethyl and isopropyl, etc., alkoxy such as methoxy, ethoxy and butoxy, etc., alkoxy-carbonyl such as methoxycarbonyl and propoxycarbonyl, etc., halogen substituent such as fluorine atom, bromine atom or iodine atom, etc., benzyl, phenyl, phenoxy, hydroxy, nitro, cyano, carboxy, methylthio and amino, can be used.

The benzoic acid compound includes for example benzoic acid, isophthalic acid monoethyl ester, 2,4-dibromobenzoic acid, 4-methylbenzoic acid, 2-methoxybenzoic acid, 2,3,5-triiodobenzoic acid, 2-chloro-4-nitrobenzoic acid, 4-fluorobenzoic acid, 4-iodobenzoic acid, 4-bromobenzoic acid, 4-tert-butylbenzoic acid, 3-trifluoromethylbenzoic acid, 2-nitrobenzoic acid, 4-isopropoxybenzoic acid, 3-cyanobenzoic acid, 4-cyanobenzoic acid, 3-phenylbenzoic acid, 3-bromo-4-methylbenzoic acid, 2,4,6-tribromobenzoic acid, 4-methylthiobenzoic acid, 2-bromo-4-fluorobenzoic acid, 4,5-dichloro-benzene-1,3-dicarboxylic acid, 5-amino-2,4,6-triiodo-isophthalic acid, benzene-1,4-dicarboxylic acid, 2,3,5,6-tetrabromo-benzene-1,4-dicarboxylic acid, 4,5-dichlorophthalic acid, 5-methoxy-3-methyl-phthalic acid, and 3,4,5,6-tetrabromophthalic acid, or the like. The benzoic acid compounds also include hydroxy benzoic acid compounds, and hydroxy benzoic acid compounds having halogen substituent are preferable. As the halogen substituent, bromo group (—Br) or iodo group (—I) is preferable from the viewpoint of absorption for F2 excimer laser beam. The hydroxy benzoic acid compounds include for example 4-hydroxy benzoic acid, 3-hydroxy benzoic acid, 3,5-dihydroxy benzoic acid, 2-amino-3-hydroxy benzoic acid, 2,5-dichloro-3-hydroxy-6-methoxy benzoic acid, 2,4,6-triiodo-3-hydroxy benzoic acid, 2,4,6-tribromo-3-hydroxy benzoic acid, 2-bromo-4,6-dimethyl-3-hydroxy benzoic acid, 2-fluoro-5-hydroxy benzoic acid, 3-methoxy-4-hydroxy benzoic acid, 3,5-dibromo-4-hydroxy benzoic acid, 2,4-dihydroxy-5-bromobenzoic acid, 3-iodo-5-nitro-4-hydroxy benzoic acid, 2-hydroxy benzoic acid, 4-chloro-2-hydroxy benzoic acid, 3,5-diiodo-2-hydroxy benzoic acid, 3-methoxy-2-hydroxy benzoic acid, 2-hydroxy-6-isopropyl-3-methyl benzoic acid, and 4-amino-3,5-diiodo-2-hydroxy benzoic acid, or the like.

In the reaction with the compound of formula (1), the benzoic acid compound can be used alone or in a suitable mixture of two or more benzoic acid compounds. For example, a combination of 4-nitrobenzoic acid with 3,5-diiodo-2-hydroxy benzoic acid can be used. For example, a combination of 4-hydroxy benzoic acid with 4-cyanobenzoic acid can be also used. Further, for example, a combination of 4-hydroxy benzoic acid with 2,3,5-triiodo benzoic acid can be used.

The content of the reaction product of the compound of formula (1) and the benzoic acid compound contained in the anti-reflective coating forming composition of the present invention is for example 50 to 99 mass %, or 60 to 95 mass %, or 65 to 90 mass % in the solid content.

The anti-reflective coating forming composition of the present invention can contain a photoacid generator. The photoacid generator can adjust the acidity of the anti-reflective coating as it generates an acid on the exposure of photoresists. This is used as a measure for conforming the acidity of the anti-reflective coating to that of the photoresist applied thereon. In addition, the adjustment of the acidity of the anti-reflective coating makes possible to adjust the pattern shape of the photoresist formed thereon. The photoacid generator includes onium salt compounds, sulfone-imide compounds, and disulfonyl diazomethane compounds, etc.

The onium salt compounds include iodonium salt compounds such as diphenyl iodonium hexafluoro phosphate, diphenyl iodonium trifluoromethane sulfonate, diphenyl iodonium nonafluoro-n-butane sulfonate, diphenyl iodonium perfluoro-n-octane sulfonate, diphenyl iodonium camphor sulfonate, bis(4-tert-butylphenyl) iodonium camphor sulfonate and bis(4-tert-butylphenyl) iodonium trifluoro methane sulfonate, etc., sulfonium salt compounds such as triphenyl sulfonium hexafluoro antimonate, triphenylsulfonium nonafluoro-n-butane sulfonate, triphenyl sulfonium camphor sulfonate and triphenyl sulfonium trifluoro methane sulfonate, etc.

The sulfoneimide compounds include for example N-(trifluoromethanesulfonyloxy) succinimide, N-(nonafluoro-n-butanesulfonyloxy) succinimide, N-(camphorsulfonyloxy) succinimide and N-(trifluoromethanesulfonyloxy) naphthalimide, etc.

The disulfonyl diazomethane compounds include for example bis(trifluoromethylsulfonyl) diazomethane, bis(cyclohexylsulfonyl) diazomethane, bis(phenylsulfonyl) diazomethane, bis(p-toluenesulfonyl) diazomethane, bis(2,4-dimethylbenzenesulfonyl) diazomethane, and methylsulfonyl-p-toluenesulfonyl diazomethane, etc.

The photoacid generator includes benzoin tosylate, pyrogallol methane sulfonic acid triester and nitrobenzyl-9,10-diethoxyanthracene-2-sulfonate and phenyl-bis(trichloromethyl)-s-triazine, etc., in addition to the above-mentioned compounds The photoacid generator can be used singly or in a combination of two or more.

The content of the photoacid generator in the anti-reflective coating forming composition of the present invention is for example 0.01 to 10 mass %, or 0.1 to 5 mass %, or 0.5 to 3 mass % in the solid content.

The anti-reflective coating forming composition of the present invention can contain a crosslinking compound. The crosslinking compound is not specifically limited, and crosslinking compounds having at least two crosslink forming substituents are preferably used. For example, nitrogen-containing compounds having two or more nitrogen atoms substituted with hydroxymethyl or alkoxymethyl can be mentioned. These compounds are for example nitrogen-containing compounds having two or more nitrogen atoms substituted with hydroxymethyl, methoxymethyl, ethoxymethyl, butoxyemthyl and hexyloxymethyl, etc.

The examples of the nitrogen-containing compounds are melamine based compounds, benzoguanamine compounds and substituted urea based compounds, etc. having crosslink forming substituent such as methylol or methoxymethyl, In addition, they include methoxymethylated glycol uril, methoxymethylated benzoguanamine and methoxymethylated melamine, etc. Specifically, they include nitrogen-containing compounds such as hexamethoxy methylmelamine, tetramethoxymethyl benzoguanamine, 1,3,4,6-tetrakis(butoxymethyl) glycoluril, 1,3,4,6-tetrakis(hydroxymethyl) glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone, etc.

In addition, as the crosslinking compound, the polymers produced by use of acrylamide compounds or methacrylamide compounds substituted with hydroxymethyl or alkoxymethyl such as N-hydroxymethyl acrylamide, N-methoxymethyl methacrylamide, N-ethoxymethyl acrylamide, and N-butoxymethyl methacrylamide, etc. can be used. Such polymers include for example poly(N-butoxymethylacrylamide), a copolymer of N-butoxymethylacrylamide with styrene, a copolymer of N-hydroxymethylmethacrylamide with methylmethacrylate, a copolymer of N-ethoxymethylmethacrylamide with benzylmethacrylate, and a copolymer of N-butoxymethylacrylamide, benzylmethacrylate and 2-hydroxypropylmethacrylate, etc.

These crosslinking compounds can occur crosslinking reaction due to self-condensation. In addition, they can occur crosslinking reaction with the hydroxy in the reaction product of the compound of formula (1) with the benzoic acid compound. The anti-reflective coating formed through such a crosslinking reaction becomes tough, and has a low solubility in organic solvents. The crosslinking compound can be used singly or a combination of two or more.

The content of the crosslinking compound in the anti-reflective coating forming composition of the present invention is for example 0.1 to 40 mass %, or 0.1 to 35 mass %, or 5 to 30 mass % in the solid content.

The anti-reflective coating forming composition of the present invention can contain an acid compound. The acid compound includes p-toluene sulfonic acid, trifluoromethane sulfonic acid, pyridinium-p-toluene sulfonate, salicylic acid, camphor sulfonic acid, sulfosalicylic acid, citric acid, benzoic acid, and hydroxy benzoic acid, etc. As the acid compound, aromatic sulfonic acid compounds can be also used. The specific examples of the aromatic sulfonic acid compounds are p-toluene sulfonic acid, pyridinium-p-toluene sulfonate, sulfosalicylic acid, 4-chlorobenzene sulfonic acid, 4-hydroxybenzene sulfonic acid, benzene disulfonic acid, 1-naphthalene sulfonic acid, and pyridinium-1-naphthalene sulfonic acid, etc. The acid compound can be used singly or a combination of two or more.

The content of the acid compound in the anti-reflective coating forming composition of the present invention is for example 0.01 to 10 mass %, or 0.1 to 5 mass %, or 0.5 to 3 mass % in the solid content.

The anti-reflective coating forming composition of the present invention can contain a polymer component, a light absorbing compound and a surfactant, etc.

The polymer component is not specifically limited, and polymers having at least one crosslink forming substituent selected from hydroxy, carboxy, amino and thiol are preferable. The addition of such a polymer makes possible to control characteristics of the anti-reflective coating formed from the anti-reflective coating forming composition of the present invention, such as refractive index, attenuation coefficient, etching rate or the like. The polymer includes a polymer containing as a structural unit, 2-hydroxyethylacrylate, 2-hydroxypropylacrylate, 2-hydroxyethylmethacrylate, 2-hydroxypropylmethacrylate, vinyl alcohol, 2-hydroxyethyl vinyl ether, acrylic acid, methacrylic acid or the like. It is sufficient that the polymer has a weight average molecular weight (in terms of standard polystyrene) of 500 to 1000000, preferably 500 to 500000, or 1000 to 100000. When the polymer is contained in the anti-reflective coating forming composition of the present invention, the content thereof is 0.1 to 20 mass %, or 0.1 to 10 mass % in the solid content.

The polymer includes for example poly-2-hydroxyethyl methacrylate, polyvinyl alcohol, polyacrylic acid, a copolymer of 2-hydroxypropylacrylate with methylmethacrylate, a copolymer of 2-hydroxypropylacrylate with anthryl methylmethacrylate, a copolymer of 2-hydroxypropylacrylate with benzylmethacrylate, a copolymer of 2-hydroxypropylmethacrylate with 2,2,2-trichloroethyl methacrylate, a copolymer of 2-hydroxypropylmethacrylate with styrene, a copolymer of 2-hydroxypropylmethacrylate with 2-chloroethyl methacrylate, a copolymer of 2-hydroxypropylmethacrylate with vinyl alcohol, a copolymer of 2-hydroxypropylmethacrylate with acrylic acid, a copolymer of 2-hydroxypropylmethacrylate with maleimide, a copolymer of 2-hydroxypropylmethacrylate, maleimide, and benzylacrylate, a copolymer of vinyl alcohol with maleimide, a copolymer of vinyl alcohol with methylmethacrylate, a copolymer of 2-hydroxyethyl vinyl ether with ethylmethacrylate, a copolymer of 2-hydroxyethyl vinyl ether with 2-hydroxypropyl methacrylate, and a copolymer of methacrylic acid with maleimide, etc.

The polymer may be also for example phenol novolak, cresol novolak, naphthol novolak, and the like.

The light absorbing compounds can be used without any limitation so long as they have a high absorption for light at photosensitive characteristic wavelength region of photosensitive components in a photoresist layer provided on the anti-reflective coating. The light absorbing compounds include for example benzophenone compounds, benzotriazole compounds, azo compounds, naphthalene compounds, anthracene compounds, anthraquinone compounds, triazine compounds, triazine trione compounds, quinoline compounds, and the like. Concrete examples are for example 1-naphthalene carboxylic acid, 2-naphthalene carboxylic acid, 1-napthhol, 2-naphthol, naphthyl acetic acid, 1-hydroxy-2-naphthalene carboxylic acid, 3-hydroxy-2-naphthalene carboxylic acid, 3,7-dihydroxy-2-naphthalene carboxylic acid, 6-bromo-2-hydroxynaphthalene, 2,6-naphthalene dicarboxylic acid, 9-anthracene carboxylic acid, 10-bromo-9-anthracene carboxylic acid, anthracene-9,10-dicarboxylic acid, 1-anthracene carboxylic acid, 1-hydroxyanthracene, 1,2,3-anthracene triol, 9-hydroxymethylanthracene, 2,7,9-anthracene triol, benzoic acid, 4-hydroxybenzoic acid, 4-bromobenzoic acid, 3-iodobenzoic acid, 2,4,6-tribromophenol, 2,4,6-tribromoresorcinol, 3,4,5-tri-iodo benzoic acid, 2,4,6-tri-iodo-3-aminobenzoic acid, 2,4,6-tri-iodo-3-hydroxybenzoic acid, and 2,4,6-tribromo-3-hydroxybenzoic acid, etc. When the light absorbing compound is contained in the anti-reflective coating forming composition of the present invention, the content thereof is 0.1 to 20 mass % or 0.1 to 10 mass % in the solid content.

The surfactants include for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc., polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Jemco Inc.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The surfactants may be used singly or in combination of two or more. When the surfactant is contained in the anti-reflective coating forming composition according to the present invention, the content thereof is 0.0001 to 5 mass % or 0.001 to 2 mass % in the solid content. The surfactants are effective for inhibiting occurrence of pinholes or striation, etc. when the anti-reflective coating forming composition is applied.

The anti-reflective coating forming composition of the present invention can contain rheology controlling agents and adhesive auxiliary agents, etc., if desired. The rheology controlling agents are effective for improving the fluidity of the anti-reflective coating forming composition, particularly for improving the filling property of the anti-reflective coating forming composition inside holes in the baking step. The adhesive auxiliary agents are effective for improving the adhesiveness between the semiconductor substrate or photoresist and the anti-reflective coating, particularly for preventing separation of the photoresist in development.

The specific examples of the rheology controlling agents are dimethyl phthalate, diethyl phthalate, diisobutyl phthalate, dihexyl phthalate, butyl isodecyl phthalate, di-n-butyl adipate, diisobutyl adipate, diisooctyl adipate, octyldecyl adipate, di-n-butyl maleate, diethyl maleate, dinonyl maleate, methyl oleate, butyl oleate, tetrahydrofurfuryl oleate, n-butyl stearate, glyceryl stearate, or the like.

The specific examples of the adhesive auxiliary agents are silanes such as trimethylchlorosilane, dimethylvinylchlorosilane, methyldiphenylchlorosilane, chloromethyldimethylchlorosilane trimethylmethoxysilane, dimethyldiethoxysilane, methyldimethoxysilane, dimethylvinylethoxysilane, diphenyldimethoxysilane, phenyltriethoxysilane, hexamethyldisilazane, N,N'-bis(trimethylsilyl)urea, dimethyltrimethylsilyl amine, trimethylsilylimidazole, vinyltrichlorosilane, γ-chloropropyltrimethoxysilane, γ-aminopropyltriethoxysilane, γ-glycidoxypropyltrimethoxysilane, etc., benzotriazole, benzimidazole, indazole, imidazole, 2-mercaptobenzimidazole, 2-mercaptobenzothiazole, 2-mercaptobenzooxazole, urazole, thiouracil, mercaptoimidazole, mercaptopyrimidine, 1,1-dimethylurea, 1,3-dimethylurea, and thiourea compounds, and so on.

As the solvent used in the anti-reflective coating forming composition of the present invention, any solvents that can dissolve the solid content can be used without any limitation. Such solvents include for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate, etc. These solvents are used singly or in combination of two or more. Further, a high boiling point solvent such as propylene glycol monobutyl ether, propylene glycol monobutyl ether acetate or the like can be mixed and used.

Hereinafter, the utilization of the anti-reflective coating forming composition of the present invention is described.

The anti-reflective coating forming composition of the present invention is applied on a semiconductor substrate (for example, silicon/silicon dioxide coat substrate, silicon nitride substrate, silicon wafer substrate, glass substrate, and ITO substrate, etc.) by a suitable coating method, for example, with a spinner, a coater or the like, and thereafter the substrate is baked to produce an anti-reflective coating. The conditions of baking are suitably selected from baking temperature of 80 to 250° C. and baking time of 0.3 to 60 minutes. Preferably the baking temperature is 130 to 250° C. and the baking time is 0.5 to 5 minutes. The thickness of the resulting anti-reflective coating is for example 0.01 to 3.0 μm, or preferably for example 0.03 to 1.0 μm, or 0.05 to 0.5 μm, or 0.05 to 0.2 μm.

Then, a photoresist layer is formed on the anti-reflective coating. The formation of the photoresist layer can be conducted by well-known process, that is, by application of a photoresist composition solution on the anti-reflective coating and baking.

The photoresist to be coated and formed on the anti-reflective coating of the present invention is not specifically limited so long as it is sensitive to the light used in exposure, and any of negative type and positive type photoresists can be used. The photoresist includes a positive type photoresist consisting of a novolak resin and 1,2-naphthoquinone diazide sulfonic acid ester, a chemically-amplified type photoresist consisting of a photoacid generator and a binder having a group which is decomposed with an acid and increases alkali dissolution rate, a chemically-amplified type photoresist consisting of an alkali-soluble binder, a photoacid generator, and a low molecular weight compound which is decomposed with an acid and increases the alkali dissolution rate of the photoresist, and a chemically-amplified photoresist consisting of a photoacid generator, a binder having a group which is decomposed with an acid and increases the alkali dissolution rate, and a low molecular weight compound which is decomposed with an acid and increases the alkali dissolution rate of the photoresist. Also, it includes fluorine atom-containing polymer type photoresist as mentioned in for example, Proc. SPIE, Vol. 3999, 330-334 (2000), Proc. SPIE, Vol. 3999, 357-364 (2000), or Proc. SPIE, Vol. 3999, 365-374 (2000).

Subsequently, exposure to light is carried out through a predetermined mask. For the exposure, KrF excimer laser beam (wavelength 248 nm), ArF excimer laser beam (wavelength 193 nm) and F2 excimer laser beam (wavelength 157 nm), etc. can be used. After the exposure, post exposure bake may be performed, if necessary. The post exposure bake is conducted by suitably selecting from a heating temperature of 70 to 150° C. and a heating time of 0.3 to 10 minutes.

Next, development is conducted by use of a developer. For example in case where a positive type photoresist is used, the development results in removal of exposed part of the photoresist and forming of photoresist pattern.

The developer includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, choline or the like, amine aqueous solution such as ethanolamine, propylamine, ethylenediamine or the like. As the developer, 2.38 mass % tetramethyl ammonium hydroxide aqueous solution that is widely used can be used. Further, surfactants can be added in these developers. The condition of development is suitably selected from a temperature of 5 to 50° C. and a time of 10 to 300 seconds.

Then, removal of the anti-reflective coating and processing of the semiconductor substrate are conducted by using the photoresist pattern formed as mentioned above as a protective coating. The removal of the anti-reflective coating is conducted by use of a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, etc.

Before forming the anti-reflective coating of the present invention on a semiconductor substrate, a flattening coating or a gap-fill material layer may be formed. In case where semiconductor substrates having large steps or holes are used, it is preferable that the flattening coating or the gap-fill material layer is formed.

The semiconductor substrates on which the anti-reflective coating forming composition of the present invention is applied may be substrates on which an inorganic anti-reflective coating is formed by CVD method or the like, and the anti-reflective coating of the present invention can be formed thereon.

Further, the anti-reflective coating of the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion of substances formed in the substrate on baking under heating to the upper layer photoresist, and as a barrier layer for reducing any poisoning effect of the photoresist layer by the semiconductor substrate dielectric layer.

In addition, the anti-reflective coating formed from the anti-reflective coating forming composition can be used as a filling agent that can fill via holes without gap by applying it for the substrate on which via holes are formed and which is used in dual damascene process. Further, it can be used as a flattening agent for flattening the surface of semiconductor substrate having unevenness.

Hereinafter, the present invention will be described based on examples further concretely but the present invention is not limited thereto.

EXAMPLES

Synthetic Example 1

After 175 g of tris(2,3-epoxypropyl) isocyanuric acid (manufactured by Nissan Chemical Industries, Ltd., trade name: TEPIC), 628 g of 3,5-diiodo-2-hydroxy benzoic acid, and 9.2 g of benzyltriethyl ammonium chloride were dissolved in 3250 g of propylene glycol monomethyl ether, the solution was subjected to reaction at 130° C. for 24 hours to obtain a solution containing a reaction product.

It was supposed that the reaction product contained an isocyanuric acid compound in which 2,3-epoxypropyl group was converted into the group of formula (5), and an oligomer (or a polymer) having the structure of formula (6).

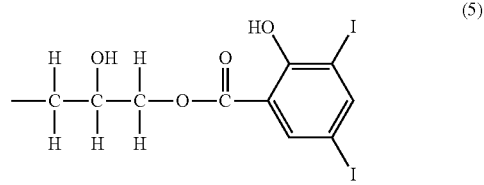

-continued

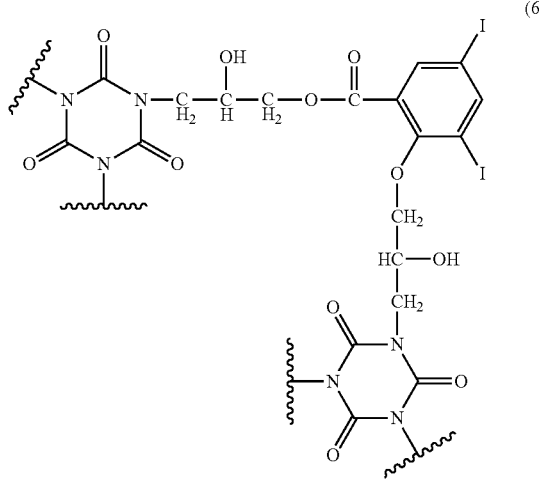

(6)

Synthetic Example 2

After 457 g of tris(2,3-epoxypropyl) isocyanuric acid (manufactured by Nissan Chemical Industries, Ltd., trade name: TEPIC), 407 g of 4-hydroxy benzoic acid, and 136 g of 4-cyanobenzoic acid were dissolved in 1000 g of propylene glycol monomethyl ether, the solution was subjected to reaction at 130° C. for 24 hours to obtain a solution containing a reaction product.

It was supposed that the reaction product contained an isocyanuric acid compound in which 2,3-epoxypropyl group was converted into the group of formula (7) or (8).

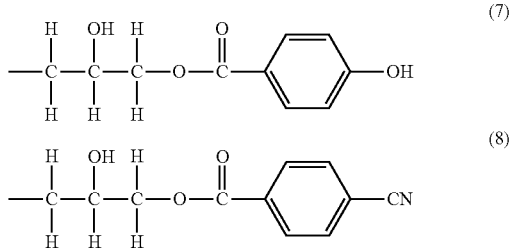

Example 1

In 23.3 g of the solution containing 4.7 g of the reaction product obtained in Synthetic Example 1, 9.6 g of propylene glycol monomethyl ether, 65.8 g of ethyl lactate, 0.11 g of triphenylsulfonium hexafluoro antimonite as a photoacid generator, 1.2 g of tetramethoxymethyl glycoluril (manufactured by Nihon Cytec Industries, Inc. (former Mitsui Cytec Co., Ltd.) trade name: Powderlink 1174), and 0.06 g of pyridinium-p-toluene sulfonate were added to obtain a solution. Then, the resulting solution was filtered through a filter made of polyethylene having a pore diameter of 0.10 µm and further a filter made of polyethylene having a pore diameter of 0.05 µm to prepare an anti-reflective coating forming composition solution.

Examples 2 to 9

The procedures in Example 1 were repeated except that the compounds described below were used instead of triphenylsulfonium hexafluoro antimonite as a photoacid generator to prepare anti-reflective coating forming composition solutions.

Example 2: Triphenylsulfonium trifluoromethane sulfonate;
Example 3: Triphenylsulfonium nonafluoro n-butane sulfonate;
Example 4: N-(Trifluoromethanesulfonyloxy) succinimide;
Example 5: Diphenyliodonium trifluoromethane sulfonate
Example 6: Bis(phenylsulfonyl) diazomethane;
Example 7: Phenyl-bis(trichloromethyl)-s-triazine;
Example 8: N-(Trifluoromethanesulfonyloxy) naphthalimide; and
Example 9: Bis(4-tert-butylphenyl) iodonium trifluoromethane sulfonate.

Example 10

In 23.3 g of the solution containing 4.7 g of the reaction product obtained in Synthetic Example 1, 9.6 g of propylene glycol monomethyl ether, 65.8 g of ethyl lactate, 1.2 g of tetramethoxymethyl glycoluril (manufactured by Nihon Cytec Industries, Inc. (former Mitsui Cytec Co., Ltd.) trade name: Powderlink 1174), and 0.06 g of pyridinium-p-toluene sulfonate were added to obtain a solution. Then, the resulting solution was filtered through a filter made of polyethylene having a pore diameter of 0.10 µm and further a filter made of polyethylene having a pore diameter of 0.05 µm to prepare an anti-reflective coating forming composition solution.

Example 11

In 19.8 g of the reaction solution obtained in Synthetic Example 2, 95 g of propylene glycol monomethyl ether, 1.00 g of tetramethoxymethyl glycoluril (manufactured by Nihon Cytec Industries, Inc. (former Mitsui Cytec Co., Ltd.) trade name: Powderlink 1174), 0.05 g of pyridinium-p-toluene sulfonate and 0.002 g of a surfactant (Megafac R-30) (manufactured by Dainippon Ink and Chemicals, Inc.) were added to obtain a solution. Then, the resulting solution was filtered through a filter made of polyethylene having a pore diameter of 0.10 µm and further a filter made of polyethylene having a pore diameter of 0.05 µm to prepare an anti-reflective coating forming composition solution.

Dissolution Test in Photoresist Solvent

The anti-reflective coating forming composition solutions obtained in Examples 1 to 11 were coated on semiconductor substrates (silicon wafer substrates) by means of a spinner, respectively. The coated silicon wafer substrates were baked at 205° C. for 1 minute on a hot plate to form anti-reflective coatings (film thickness 0.08 µm). The anti-reflective coatings were dipped in ethyl lactate and propylene glycol monomethyl ether being solvents used for photoresists. It was confirmed that the resulting anti-reflective coatings were insoluble in these solvents.

Test of Intermixing with Photoresist

The anti-reflective coating forming composition solutions obtained in Examples 1 to 11 were coated on silicon wafer substrates by means of a spinner, respectively. The coated silicon wafer substrates were baked at 205° C. for 1 minute on a hot plate to form anti-reflective coatings (film thickness 0.08 µm). On the anti-reflective coatings, a commercially available photoresist solution (trade name: PAR710 manufactured by Sumitomo Chemical Co., Ltd.) was coated by means of a spinner, and heated at 90° C. for 1 minute on a hot plate to form photoresist layers. After exposure of the photoresists to light, post exposure bake was performed at 90° C. for 1.5 minute. After developing the photoresists, the film thickness of the anti-reflective coatings was measured and it was confirmed that no intermixing occurred between the anti-reflective coatings and the photoresists.

Test of Optical Parameter

The anti-reflective coating forming composition solutions prepared in Examples 1 to 11 were coated on silicon wafer substrates by means of a spinner. The coated silicon wafer substrates were baked at 205° C. for 1 minute on a hot plate to form anti-reflective coatings (film thickness 0.06 µm). On the anti-reflective coatings, refractive index (n) and attenuation coefficient (k) at a wavelength of 193 nm and a wavelength of 157 nm were measured with a spectroscopic ellipsometer (manufactured by J. A. Woolam Co., Inc., VUV-VASE VU-302). The refractive index and attenuation coefficient at a wavelength of 193 nm of the anti-reflective coatings obtained from Examples 1 to 10 were 1.81 and 0.44, respectively. The refractive index and attenuation coefficient at a wavelength of 157 nm of the anti-reflective coatings obtained from Examples 1 to 10 and were 1.60 and 0.44, respectively. The refractive index and attenuation coefficient at a wavelength of 193 nm of the anti-reflective coating obtained from Example 11 were 1.69 and 0.47, respectively.

Observation of Photoresist Pattern Shape

The anti-reflective coating forming composition solutions obtained in Examples 1 to 11 were coated on silicon wafer substrates by means of a spinner, respectively. The coated silicon wafer substrates were baked at 205° C. for 1 minute on a hot plate to form anti-reflective coatings (film thickness 0.08 µm). On the anti-reflective coatings, a commercially available photoresist solution (trade name: TARF-P6111 manufactured by Tokyo Ohka Kogyo Co., Ltd.) was coated by means of a spinner, and heated at 90° C. for 1 minute on a hot plate to form photoresist layers (film thickness 0.33 µm). Then, the photoresist layers were exposed to light thorough a mask that line-width and width between lines of the photoresist after development are 0.09 µm, that is, has 0.09 µmL/S (dense line), and that is set so as to form 9 of the above-mentioned lines, by use of PAS5500/9900 Scanner (wavelength 193 nm, NA, σ: 0.63, 0.87/0.57 (Annular)) manufactured by ASML. Thereafter, post exposure bake was performed at 130° C. for 1 minute on a hot plate, cooled, and then it was developed with 0.26 N tetramethyl ammonium hydroxide developer for 1 minute by single paddle process being industrial standard to form a photoresist pattern.

The cross-sectional shape of the resulting photoresist pattern was observed with a scanning electron microscope (SEM). The anti-reflective coatings formed from Examples 10 and 11 were observed to have a little footing at the lower part of the photoresists. The anti-reflective coatings formed from Examples 1 to 9 were observed to have no footing at the lower part of the photoresists.

The invention claimed is:

1. A method for forming a photoresist pattern having no footing at the lower part of the photoresist for use in manufacturing semiconductor devices, comprising:
    coating an anti-reflective coating forming composition on a semiconductor substrate, and baking it to form an anti-reflective coating;
    forming a photoresist layer on the anti-reflective coating;
    exposing the semiconductor substrate covered with the anti-reflective coating and the photoresist layer to light; and
    developing the photoresist layer after the exposure to light to form a photoresist pattern having no footing at the lower part; wherein
    the anti-reflective coating forming composition comprises: a reaction product, an oligomer of the reaction product, a crosslinking compound, a solvent, and an acid compound, wherein
    the reaction product is a mixture of:
        a compound having a structure obtained by a reaction of an epoxy group of a compound of formula (1)

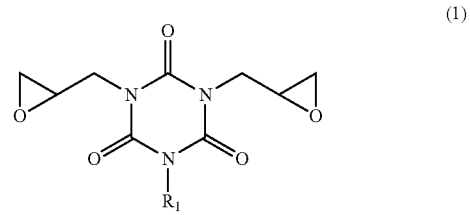

where $R_1$ is 2,3-epoxypropyl, with a carboxy group of a hydroxy benzoic acid compound; and
        a compound having a structure obtained by a reaction of one epoxy group of the compound of formula (1) with a hydroxy group and another epoxy group of formula (1) with a carboxy group of the hydroxy benzoic acid compound,
    the oligomer of the reaction product is obtained by a reaction of an epoxypropyl group of the compound of formula (1) with a carboxy group of the hydroxy benzoic acid compound and by a reaction of an epoxypropyl group of another compound of formula (1) with a hydroxy group of the hydroxy benzoic acid compound,
    the acid compound comprises pyridinium-p-toluene sulfonate,
    the reaction product is obtained by reacting the compound of formula (1) with the hydroxy benzoic acid compound in a molar ratio of 1:2 to 1:3 (the compound of formula (1): the hydroxy benzoic acid compound),
    the crosslinking compound comprises tetramethoxymethyl glycoluril,
    the content of the photoacid generator is 0.1 to 5 mass % of the solid content of the anti-reflective coating forming composition,
    the content of the acid compound is 0.1 to 5 mass % of the solid content of the anti-reflective coating forming composition,
        wherein the solid content of the anti-reflective coating forming composition is with respect to the mass of the anti-reflective coating forming composition excluding the solvent, and
    the anti-reflective coating has
        a thickness of 0.01 to 3.0 µm,
        a refractive index (n) at a wavelength of 193 nm of around 1.81, and
        an attenuation coefficient (k) of around 0.44.

2. A method for forming a photoresist pattern having no footing at the lower part of the photoresist for use in manufacturing semiconductor devices, comprising:
    coating an anti-reflective coating forming composition on a semiconductor substrate, and baking it to form an anti-reflective coating;
    forming a photoresist layer on the anti-reflective coating;

exposing the semiconductor substrate covered with the anti-reflective coating and the photoresist layer to irradiation light of F2 excimer laser beam (wavelength 157 nm); and developing the photoresist layer after the exposure to light to form a photoresist pattern having no footing at the lower part; wherein the anti-reflective coating forming composition comprises: a reaction product, an oligomer of the reaction product, a crosslinking compound, a solvent, and an acid compound, wherein the reaction product is a mixture of:

a compound having a structure obtained by a reaction of an epoxy group of a compound of formula (1)

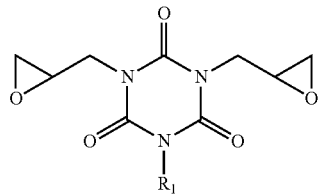

(1)

where $R_1$ is 2,3-epoxypropyl, with a carboxy group of a hydroxy benzoic acid compound; and a compound having a structure obtained by a reaction of one epoxy group of the compound of formula (1) with a hydroxy group and another epoxy group of formula (1) with a carboxy group of the hydroxy benzoic acid compound, the oligomer of the reaction product is obtained by a reaction of an epoxypropyl group of the compound of formula (1) with a carboxy group of the hydroxy benzoic acid compound and by a reaction of an epoxypropyl group of another compound of formula (1) with a hydroxy group of the hydroxy benzoic acid compound, the acid compound comprises pyridinium-p-toluene sulfonate, the reaction product is obtained by reacting the compound of formula (1) with the hydroxy benzoic acid compound in a molar ratio of 1:2 to 1:3 (the compound of formula (1): the hydroxy benzoic acid compound), the crosslinking compound comprises tetramethoxymethyl glycoluril, the content of the photoacid generator is 0.1 to 5 mass % of the solid content of the anti-reflective coating forming composition, the content of the acid compound is 0.1 to 5 mass % of the solid content of the anti-reflective coating forming composition wherein the solid content of the anti-reflective coating forming composition is with respect to the mass of the anti-reflective coating forming composition excluding the solvent, and the anti-reflective coating has a thickness of 0.01 to 3.0 μm, a refractive index (n) at a wavelength of 193 nm of around 1.81, and an attenuation coefficient (k) of around 0.44.

* * * * *